United States Patent
Bø

(10) Patent No.: US 9,542,507 B2
(45) Date of Patent: Jan. 10, 2017

(54) FEATURE DETECTION IN SEISMIC VOLUMES

(71) Applicant: Schlumberger Technology Corporation, Sugar Land, TX (US)

(72) Inventor: Trond Hellem Bø, Randaberg (NO)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 556 days.

(21) Appl. No.: 13/769,905

(22) Filed: Feb. 19, 2013

(65) Prior Publication Data

US 2013/0226545 A1 Aug. 29, 2013

Related U.S. Application Data

(60) Provisional application No. 61/602,234, filed on Feb. 23, 2012.

(51) Int. Cl.
  *G06G 7/48* (2006.01)
  *G06F 17/50* (2006.01)
  *G01V 1/30* (2006.01)

(52) U.S. Cl.
  CPC .......... *G06F 17/5009* (2013.01); *G01V 1/301* (2013.01); *G01V 1/302* (2013.01)

(58) Field of Classification Search
  CPC .. G06F 17/5018; G06F 17/5086; E21B 43/00; E21B 43/26; G01V 99/005; G06T 17/05
  (Continued)

(56) References Cited

U.S. PATENT DOCUMENTS 4,293,933 A   10/1981   Park et al.
4,302,723 A   11/1981   Moran
(Continued)

FOREIGN PATENT DOCUMENTS

EP   1274045   1/2003
EP   2113793   4/2009
(Continued)

OTHER PUBLICATIONS

Dorit Borrmann, NPL, "The 3D Hough Transform for Plane Detection in Point Clouds: A Review and a new Accumulator Design", Feb. 13, 2011 (google).*
(Continued)

*Primary Examiner* — Omar Fernandez Rivas
*Assistant Examiner* — Iftekhar Khan
(74) *Attorney, Agent, or Firm* — Alec J. McGinn

(57) ABSTRACT

Methods, systems, and computer-readable media for analyzing a domain are provided. The method includes defining a mask plane that includes a first dimension of a first number of voxels and a second dimension of a second number of voxels, and selecting a plurality of first angles for orientating the mask plane in the domain with respect to a first axis. The method also includes for each one of the plurality of first angles selected populating, using one or more processors, sum cubes associated with each one of a first plurality of subject voxels. The method also includes selecting a plurality of second angles, and for each one of the plurality of second angles selected, calculating a planar sum for each one of a second plurality of subject voxels selected.

20 Claims, 9 Drawing Sheets

(58) Field of Classification Search
USPC .................................................. 703/7, 9, 10
See application file for complete search history.

(56) References Cited

U.S. PATENT DOCUMENTS

| | | | |
|---|---|---|---|
| 4,316,250 | A | 2/1982 | Vincent |
| 4,760,563 | A | 7/1988 | Beylkin |
| 5,235,857 | A | 8/1993 | Anderson |
| 5,671,136 | A | 9/1997 | Willhoit, Jr. |
| 5,677,893 | A | 10/1997 | de Hoop et al. |
| 5,852,588 | A | 12/1998 | de Hoop et al. |
| 5,892,732 | A | 4/1999 | Gersztenkorn |
| 5,987,388 | A | 11/1999 | Crawford et al. |
| 6,125,203 | A | 9/2000 | Keskes et al. |
| 6,266,618 | B1 | 7/2001 | Ye et al. |
| 6,625,544 | B1 | 9/2003 | Laurent et al. |
| 6,636,809 | B1 | 10/2003 | Herrmann |
| 6,735,528 | B2* | 5/2004 | Robinson ............... G01V 1/364 702/17 |
| 6,856,910 | B2 | 2/2005 | Goswami et al. |
| 6,895,336 | B2 | 5/2005 | Trickett |
| 7,202,670 | B2 | 4/2007 | Omeragic et al. |
| 7,203,342 | B2 | 4/2007 | Pedersen |
| 7,239,578 | B2* | 7/2007 | Robinson ............... G01V 1/364 367/43 |
| 7,373,252 | B2 | 5/2008 | Sherrill et al. |
| 7,561,491 | B2* | 7/2009 | Robinson ............... G01V 1/364 367/24 |
| 7,639,564 | B2 | 12/2009 | Paffenholz et al. |
| 7,733,741 | B2 | 6/2010 | Pan |
| 7,821,869 | B2 | 10/2010 | Wood |
| 7,936,640 | B2 | 5/2011 | Robinson |
| 7,948,826 | B2 | 5/2011 | Wood |
| 8,045,806 | B2* | 10/2011 | Lettenbauer et al. ........ 382/190 |
| 8,120,991 | B2 | 2/2012 | Koren et al. |
| 8,451,684 | B2* | 5/2013 | Lee ........................ G01V 1/28 367/38 |
| 8,463,551 | B2 | 6/2013 | Aarre |
| 8,472,674 | B2 | 6/2013 | Yevskyy et al. |
| 2009/0067286 | A1 | 3/2009 | Bose et al. |
| 2009/0259404 | A1 | 10/2009 | Hirabayashi et al. |
| 2012/0004849 | A1 | 1/2012 | Aarre |
| 2012/0218861 | A1* | 8/2012 | Xia ........................ G01V 1/303 367/73 |
| 2012/0283953 | A1 | 11/2012 | Bo |
| 2014/0149046 | A1* | 5/2014 | Baina .................... G01V 1/282 702/14 |

FOREIGN PATENT DOCUMENTS

| | | |
|---|---|---|
| WO | 2005017564 | 2/2005 |
| WO | 2006055137 | 5/2006 |

OTHER PUBLICATIONS

Karnieli et al "Automatic Extraction and Evaluation of Geological Linear Features from Digital Remote Sensing Data Using a Hough Transform" 62 Photogrammetric Engineering & Remote Sensing 525-531 (1996).

Jeong et al "Interactive 3D Seismic Fault Detection on the Graphics Hardware" Volume Graphics (2006).

Argialas et al "Comparison of Edge Detection and Hough Transform Techniques for the Extraction of Geologic Features" 34 Int'l Archives of the Photogrammetry, Remote Sensing and Spatial Information Sciences (2004).

P. Steeghs, "Fast computation of the sliding-window Radon transform with application to attribute extraction", Proceedings of the SEG Meeting, Houston, TX/USA, Jan. 1999 (4 pgs).

Canadian Application No. 2,730,580, Office Action dated Oct. 25, 2013 (94.0266).

Cooper, et al, "Edge enhancement of potential-field data using normalized statistics", Geophysics, vol. 73(3), 2008, pp. H1-H4.

Aarre, Globally Consistent Dip Estimation; Schlumberger Information Solutions; SEG 2010 Annual Meeting, pp. 1387-1391.

Iske, "Part 1: Automatic Fault Extraction Using Artificial Ants", Mathematical Methods and Modeling in Hydrocarbon Exploration and Production, Springer Verlag, Berlin, Heideberg, DE, 2005, pp. 107-116.

Kanezaki, A., et al, "Scale and Rotation Invariant Color Features for Weakly-Supervised Object Learning in 3D Space", 2011 IEEE International Conference on Computer Vision Workshops, 2011, pp. 617-624.

GB Application No. 1207873.9 Search Report dated Aug. 19, 2012, 9 pgs (11.0268).

GB Application No. 1206737.7 Search Report dated Aug. 2, 2012, 4 pgs (11.0086).

\* cited by examiner

FEATURE DETECTION IN SEISMIC VOLUMES

CROSS-REFERENCE TO RELATED APPLICATION

This application claims the benefit of a related U.S. Provisional Application Ser. No. 61/602,234, filed on Feb. 23, 2012, which is incorporated by reference herein it its entirety.

BACKGROUND

Seismic modeling and simulation of subterranean formations may employ a process in which collected seismic data may be used to construct a two-dimensional or three-dimensional model of the formation. In such processes, the seismic data may be in the form of properties of signals that are received after being transmitted through an area of interest, for example, around a borehole, vertically and/or angled from the surface (e.g., land, the ocean floor, etc.), or in other locations. The signal characteristics may include direction, time taken to propagate through the area, amplitude, among a variety of others possible. This information may be combined with knowledge of rock properties and/or the subterranean formation to link these properties to the structure of the formation. Accordingly, the properties of a number of signals may be combined to construct an approximation of the structure of the formation.

The recognition of certain features, e.g., faults, horizons, etc., may be of particular interest in such modeling. However, in some cases, the area of interest, number of signals, number of features, or a combination thereof may be large, such that it would be useful to employ computers to automatically detect, enhance, and extract information about the features. One way this is done is by using a windowed Radon transform. Briefly, a system may discretize the area of interest into pixels (two dimensions) or voxels (three dimensions). The system may then sum the signal property (e.g., intensity) of the pixel or voxel with those of a certain number of its neighbors in a range of directions. If the intensity sum for the subject pixel or voxel is higher in one direction, it may be flagged as part of a possible feature. Next, the system may look for the next pixel or voxel that is part of the same feature or may simply move on to the next pixel or voxel in sequence. Such techniques may employ a "brute force" method, such that a line or plane extending from the subject pixel or voxel sweeps across a range of angles, calculating the intensity sum for each angle, and then moving on to the next pixel or voxel and repeating the process.

SUMMARY

Embodiments of the present disclosure may include systems, methods, and computer-readable mediums for analyzing a domain, e.g., detecting features in the domain, particularly a discretized domain. In one embodiment, the method may employ an efficient version of a windowed Radon transform to rapidly calculate a sum of all energies in a mask plane. The method may precalculate intermediate sums in a certain azimuth angle of values associated with each voxel, for example, using running sums to capitalize on redundancies. The method may then calculate the sum of the intermediate sums for each dip angle in a range of dip angles, such that the sum of the intermediate sums for each dip angle may be conceptually equivalent to a sum of voxels in a plane oriented at the azimuth angle and each of the dip angles. The method may also capitalize on redundancies in the planar sum calculation by using running sums. The method may repeat this until each selected azimuth angle and dip angle combination is analyzed for each selected voxel, thereby completing a three-dimensional the windowed Radon transform with improved efficiency.

This summary is provided to introduce some of the subject matter described below and is not to be considered limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Figure 1:
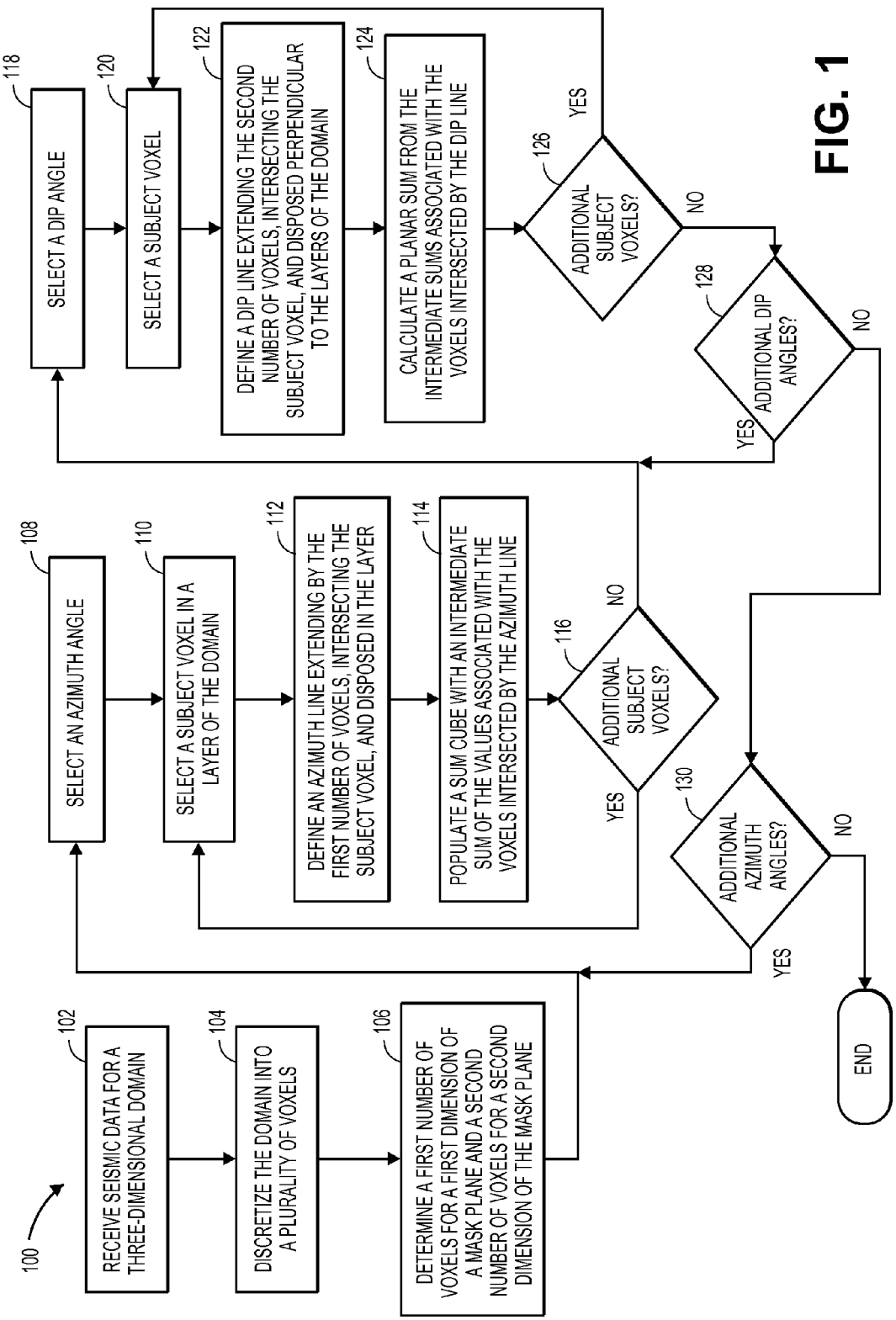
FIG. 1 illustrates a flowchart of a method for analyzing a domain, according to an embodiment.

The following detailed description refers to the accompanying drawings. Wherever convenient, the same reference numbers are used in the drawings and the following description to refer to the same or similar parts. While several embodiments and features of the present disclosure are described herein, modifications, adaptations, and other implementations are possible, without departing from the spirit and scope of the present disclosure. Accordingly, the following detailed description does not limit the present disclosure. Instead, the proper scope of the disclosure is defined by the appended claims.

In the field of seismic analysis, aspects of a geologic environment may be defined as attributes or "features." In general, seismic attributes may help to condition seismic amplitude data for improved structural interpretation tasks, such as determining the location of lithological terminations and helping to isolate hidden seismic stratigraphic features of a geologic environment. Attribute analysis may assist in defining a trap in exploration or delineating and characterizing a reservoir at the appraisal and development phase, for example. An attribute generation process may rely on a library of various seismic attributes (e.g., for display and use with seismic interpretation and reservoir characterization workflows). In some cases, generation of attributes on the fly for rapid analysis may be conducted. In other cases, attribute generation may be conducted a background process (e.g., a lower priority thread in a multithreaded computing environment), which may allow for execution of one or more foreground processes (e.g., to enable a user to continue using various components).

Attributes may help extract value from seismic and other data, for example, by providing more detail on subtle lithological variations of a geologic environment (e.g., an environment that includes one or more reservoirs). In general, an accurate reconstruction of paleostress may be difficult to achieve for a geologic environment. In particular, stress magnitudes may be difficult to reconstruct based on borehole data (e.g., as acquired over a field grid). Stress magnitudes may be helpful to understand and exploit resources in reserves such as carbonate reserves.

Carbonate rocks, however, may present a challenge for petrophysical analysis. Carbonates may be deposited primarily through biological activity where the resulting rock composition (e.g., of fossil fragments and other grains of widely varying morphology) produces highly complex pore shapes and sizes. Carbonate mineral species may also be comparatively unstable and subjected to multiple stages of dissolution, precipitation, and recrystallization, adding further complexity to the porosity and permeability of the rocks. Further, relationships between depositional attributes, porosity, and permeability may be obscured by such physical, biological, and chemical influences, operating at different scales, during and continuing after deposition.

According to an embodiment of the method disclosed herein, a "windowed" Radon transform may be employed to enhance identification of features such as cracks, faults, discontinuities, etc., which, in turn, may provide for a more comprehensive understanding of a reservoir environment. While various examples are described with respect to analysis of seismic data, techniques may be used for other types of data especially where implementations of a windowed Radon transform may benefit from reduction in requirements for computational resources. In the windowed Radon transform analysis, runtime may depend upon, e.g., image size, mask (or window) dimensions, and the number of angles, combinations thereof and/or others.

Turning to the implementations and aspects described herein for illustrative purposes, FIG. 1 depicts a method 100 for analyzing a domain, e.g., detecting features in the domain, according to an embodiment. The method 100 may, for example, provide a process for performing a windowed Radon transform with a reduced runtime.

The method 100 may begin by receiving seismic data corresponding to a domain, as at 102. For example, the seismic data may include intensity, amplitude, velocity, etc., of any type of seismic wave (e.g., compression waves, shear waves, etc.). The seismic data may then be employed to generate a model of the domain. The domain may be three-dimensional, having a length, width, and depth, corresponding to a subterranean area of interest, for example. Further, the domain may be discretized into a plurality of voxels, i.e., smaller cubes (or any other suitable three-dimensional shape), as at 104, which each represent a portion of the domain. Each voxel may be associated with information, for example, corresponding to one or more values associated with the seismic data for the volume that the voxel occupies in the domain.

Figure 2:
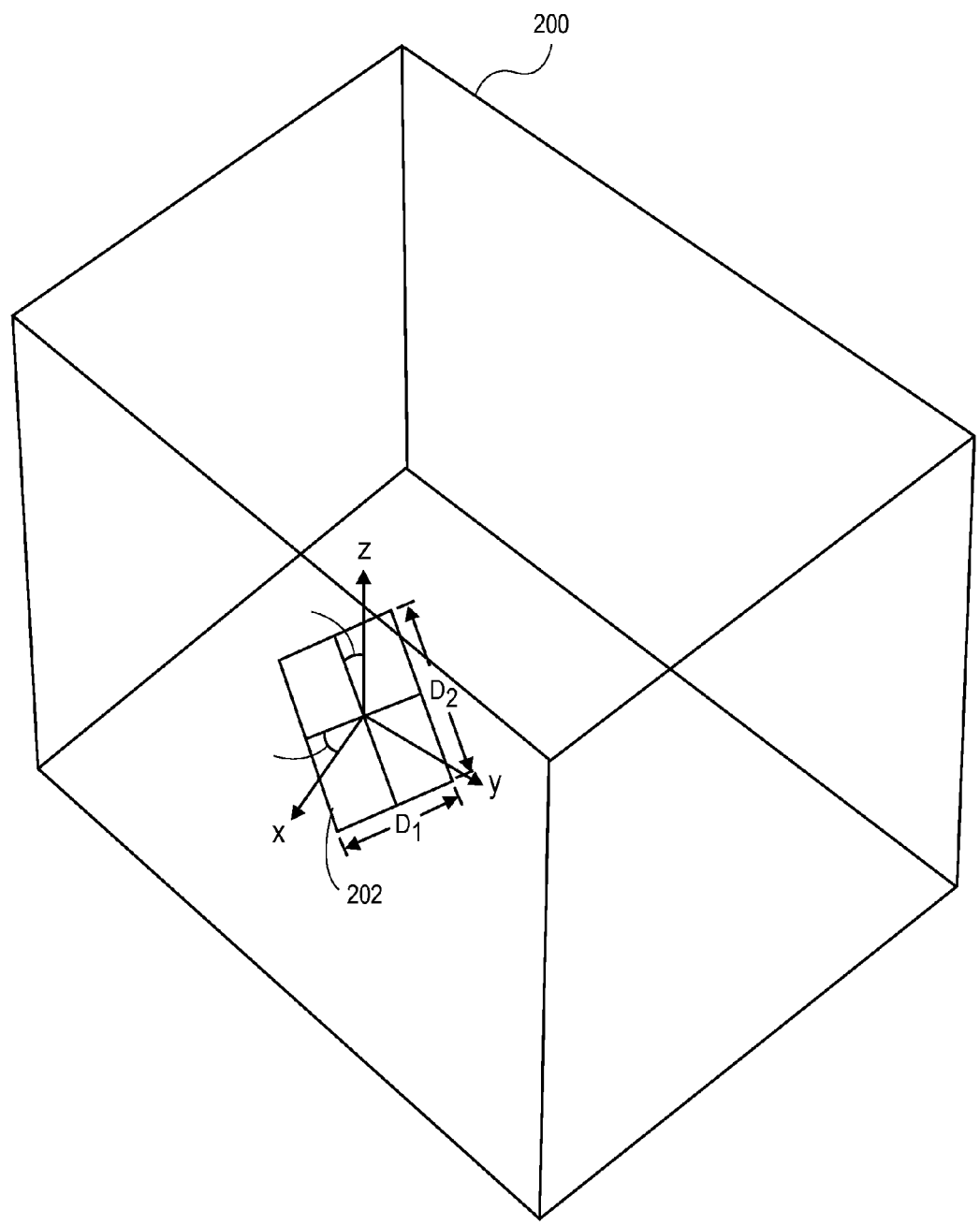
FIG. 2 illustrates a mask plane in a three-dimensional domain, according to an embodiment.

With continuing reference to FIG. 1, FIG. 2 illustrates a conceptual view of a domain 200 and a mask plane 202 for use in performing a windowed Radon transform analysis of the domain 200. The domain 200 may be discretized into voxels; however, for the sake of clearly illustrating the mask plane 202, the voxels are not shown in FIG. 2. The method 100 may include determining first and second dimensions for the mask plane 202, as at 106 (FIG. 1). The first dimension may be measured by number of voxels D1 of the mask plane 202 and another number of voxels D2 may define the second dimension. The numbers of voxels D1, D2 may depend on the size and complexity of the domain 200 and/or the features contained therein, along with the level of granularity of the model that is suitable for analysis. The numbers of voxels D1, D2 may be the same or different. Further, the number of voxels D1, D2 may be chosen so as to minimize the number of operations for the windowed Radon transform analysis, which may increase for higher numbers of voxels D1, D2, while providing statistically relevant information.

The mask plane 202 may have an orientation defined by an azimuth angles θ and a dip angle φ. The azimuth angles θ may define the angle between the x-axis and the mask plane 202, and the dip angle φ may define the angle between the z-axis and the mask plane 202. Accordingly, for a full three-dimensional windowed Radon transform by the "brute force" method, sums from each voxel intersected by the mask plane 202 in each dip angle φ and each azimuth angles θ combination are provided. To reduce the time complexity associated with such an analysis, the number of mask planes 202 may be limited, e.g., such that sequential planes associated with a given voxel are separated by at least one voxel at their outer extremities, thereby, for example, providing a unique set of voxels intersected by the mask plane 202 in each orientation. In one example implementation, D1×D2× 16 planes 202 may be provided for each voxel. To fully calculate the windowed Radon transform for an individual voxel using the "brute force" method, values for each of the D1×D2 voxels in each mask plane 202 are summed. Since there are, e.g., D1×D2×16 mask planes 202 per voxel, the total number of operations to calculate the sum of each of the values of the voxels intersected by the mask plane 202 may be $D1^2 \times D2^2 \times 16$. In some cases, the windowed Radon transform may include calculating this sum for each voxel of the domain 200. If the domain has dimensions of N1 voxels by N2 voxels by N3 voxels, the total number of operations may be $N1 \times N2 \times N3 \times D1^2 \times D2^2 \times 16$ to perform the windowed Radon transform for the domain 200.

Figure 3:
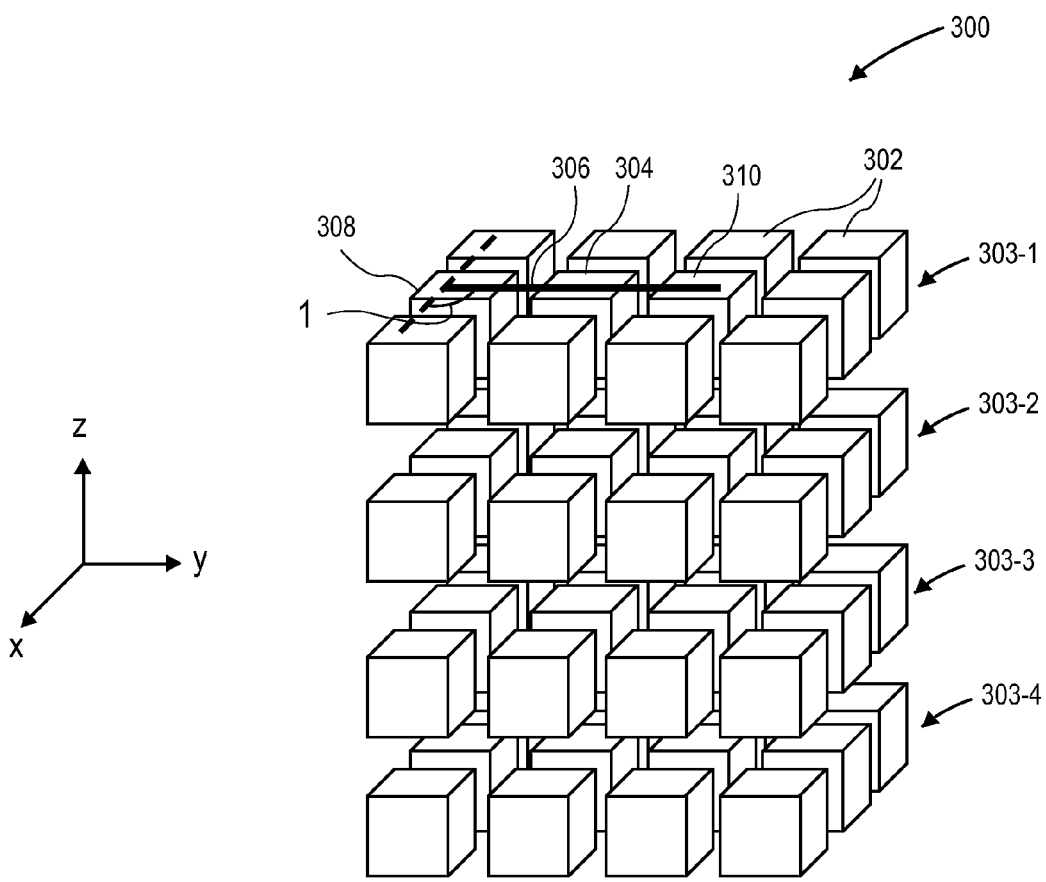
FIG. 3 illustrates an azimuth line defined for a subject voxel in a discretized, three-dimensional domain, according to an embodiment.

In various embodiments, the method 100 may advance over the brute force method. For example, the method 100 may include calculating sum cubes for at least some of the voxels of the domain 200, for example, by separating the analysis for azimuth angles and dip angles for each mask plane 202. FIG. 3 illustrates the domain in discretized form, labeled as 300, according to an embodiment. As shown, the discretized domain 300 may be discretized into a plurality of voxels 302 at 104 (FIG. 1). The voxels 302 may be aligned in layers (four shown: 303-1, 303-2, 303-3, and 303-4). Each layer 303-1, 303-2, 303-3, 303-4 may extend parallel to a common reference plane, for example, the x-y plane.

Referring again to FIG. 1, the method 100 may proceed to selecting an azimuth angle θ for the mask plane 202 (FIG. 2) for analysis, as at 108. The method 100 may, in an embodiment, regard the voxels 302 individually. Further, in the illustrated example, the selected azimuth angle $\theta_1$ may be 90°.

For purposes of discussion, the voxel 302 currently being analyzed is referred to herein as a "subject" voxel. Accordingly, the method 100 may proceed to selecting a subject voxel from among the plurality of voxels 302, disposed in a layer, as at 110. For example, as shown in FIG. 3, the method 100 may include selecting a subject voxel 304 disposed in layer 303-1. Further, in the domain 300, the first number of voxels D1 determined at 106, that is, the length of the mask plane 202 in the x-y plane (see FIG. 2), may be three.

With the azimuth angle $\theta_1$ selected at 108 and the subject voxel 304 selected at 110, the method 100 may, in an embodiment, proceed to defining an azimuth line, as at 112. FIG. 3 further illustrates an azimuth line 306 extending at the first azimuth angle $\theta_1$ (90°), with the azimuth line 306 intersecting the subject voxel 304. In an embodiment, the azimuth line 306 may be centered on the subject voxel 304, as shown; however, in other embodiments, the azimuth line 306 may intersect the subject voxel 304 at a non-center location.

Further, the azimuth line 306 may extend the first number D1 of voxels 302 in the same layer 303-1 as the subject voxel 304. Accordingly, in at least one embodiment in which the azimuth line 306 is centered on the subject voxel 304 and extends a length of three voxels (D1), the azimuth line 306 may intersect the subject voxel 304 and two additional voxels 308, 310. The voxels that are intersected by the azimuth line 306 may be referred to as "neighbor" voxels to the subject voxel 304. Neighbor voxels may be any number of voxels away from the subject voxel 304, for example, with each voxel therebetween also being a neighbor voxel.

The method may then proceed to populating a sum cube with an intermediate sum associated with the subject voxel 304 and the azimuth line 306, as at 114. In an embodiment, calculating the intermediate sum for the subject voxel 304 may proceed by summing values associated with the subject voxel 304 and the other voxels 308, 310 (e.g., neighbor voxels) that are intersected by the azimuth line 306. In one example, the values may be associated with seismic data contained in the voxels 304, 308, 310. Further, this intermediate sum may be stored in the sum cube, i.e., indexed to the location of the subject voxel 304 and the azimuth angle $\theta_1$ of the azimuth line 306, thereby populating the sum cube for the subject voxel 304.

Figure 4:
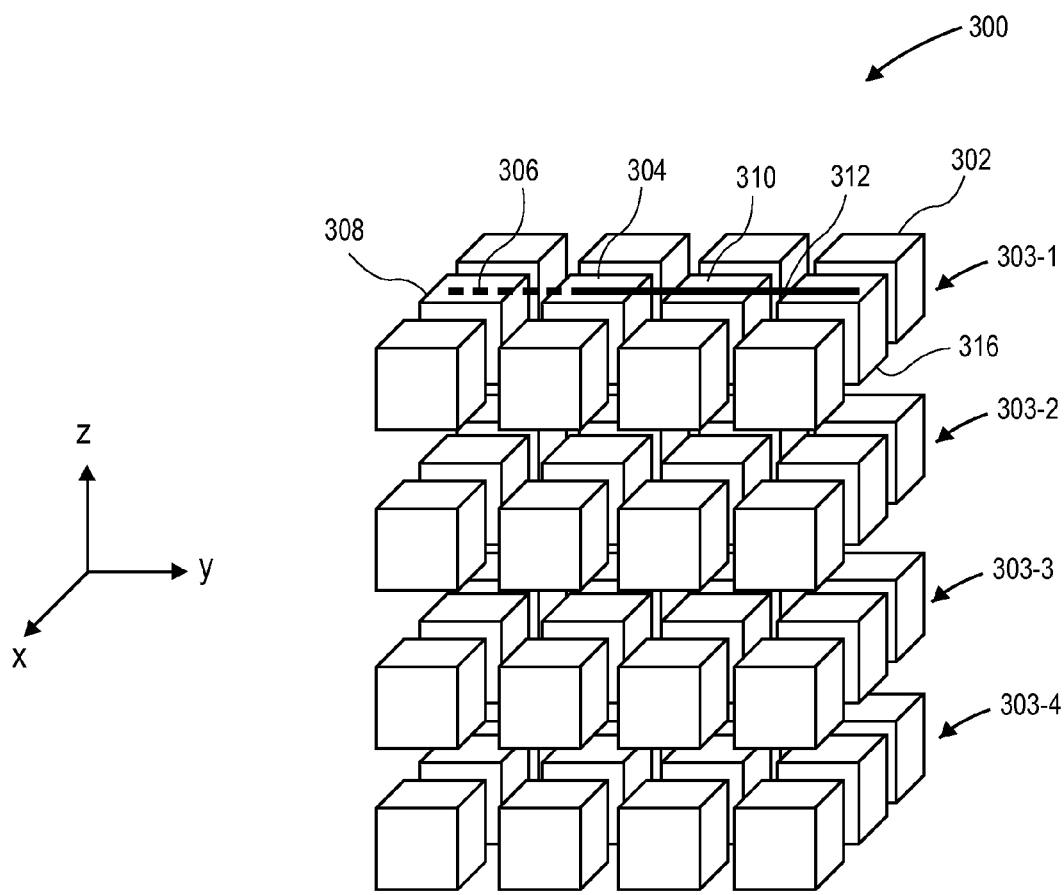
FIG. 4 illustrates an azimuth line for another subject voxel in the discretized, three-dimensional domain, according to an embodiment.

The method 100 may determine whether to calculate intermediate sums for additional subject voxels 302, as at 116. If the final subject voxel for calculation has not yet been reached, the method 100 may loop back to selecting a (next) subject voxel, as at 110. In an embodiment, this subsequent selection at 110 may shift the method 100 to considering the voxel 310 as the next subject voxel, as illustrated in FIG. 4.

The voxel 310 may be chosen as the next subject voxel at least because it is adjacent to the previous subject voxel 304 and is intersected by the azimuth line 306. The analysis of the voxel 310 may be similar to the analysis of the subject voxel 304, but may be simplified by capitalizing on redundancy using a "running sum" technique. That is, an azimuth line 312 may be defined, as at 114, centered on the subject voxel 310 and extending in the layer 303-1 for the first number D1 (e.g., three) of voxels 302, as shown. The azimuth line 312 may extend at the selected first azimuth angle $\theta_1$, as the azimuth line 306 did. Further, the subject voxel 310 may be displaced from the previous subject voxel 304 by a number N of voxels 302, e.g. one voxel (i.e., voxels 304 and 310 are adjacent), in the direction of the azimuth lines 306, 312. Accordingly, the azimuth lines 306 and 312 may be overlapping, intersecting D1-N of the same voxels 302. For the illustrated embodiment in which N is one and D1 is three, the azimuth line 306 extends to intersect voxel 308, but not voxel 316, while azimuth line 312 intersects voxel 316 but not 308. Thus, the azimuth line 306 intersects two voxels, voxels 304 and 310, which the azimuth line 306 also intersects.

Thus, shifting consideration to the subject voxel 310 after the subject voxel 304 may yield all the same voxels 302 intersected by the azimuth lines 306, 312, except N number of voxels 302 at the end (or beginning) of the azimuth lines 306, 312. Thus, rather than summing all D1 (three) values associated with the D1 intersected voxels 304, 310, 316 to arrive at the intermediate sum for the subject voxel 310 in the azimuth angle $\theta_1$ of the azimuth line 312, calculating the intermediate sum for populating the sum cube at 114 may employ a "running sum" technique.

For example, the running sum may initially be the sum calculated for the previous subject voxel 304. From this sum, the value associated with the voxel 308 that is intersected by the azimuth line 306 for the previous subject voxel 304, but not intersected by the azimuth line 312 of the current subject voxel 310 may be subtracted from the running sum. Further, the value associated with the voxel 316 that is intersected by the azimuth line 312, but not by the azimuth line 306 may be added to the running sum. The order in which this subtraction and addition occurs may be switched. Further, in embodiments where N is greater than one, a corresponding number of additions and subtractions may also be employed to keep a running sum.

As such, instead of performing the first number D1 (e.g., three) of operations to calculate the sums for the first number D1 of voxels 304, 310, 314 intersected by the azimuth line 312, the method 100 performs 2×N (one subtraction and one addition for each non-overlapping voxel) operations to calculate the same sum. In cases where the first number D1 is large (e.g., 10, 100, 1000, 10,000, or more), this may result in a large number of operations being avoided. Further, in cases where many (e.g., millions) of intermediate sums are calculated, even a reduction of one operation per calculation may reduce runtime.

In this manner, proceeding from one subject voxel to another, employing the same first azimuth angle $\theta_1$ and capitalizing on redundancies using the running sums, the method 100 may populate the sum cube with intermediate sums for each (or a selected subset) of the voxels 302 corresponding to sums for the azimuth angle $\theta_1$. As such, the method 100 may iterate through blocks 110-116 until the sum cubes are populated with intermediate sums for one, some, or a select subset of all the voxels 302 and using azimuth angle $\theta_1$ as the direction for the azimuth lines.

Figure 5:
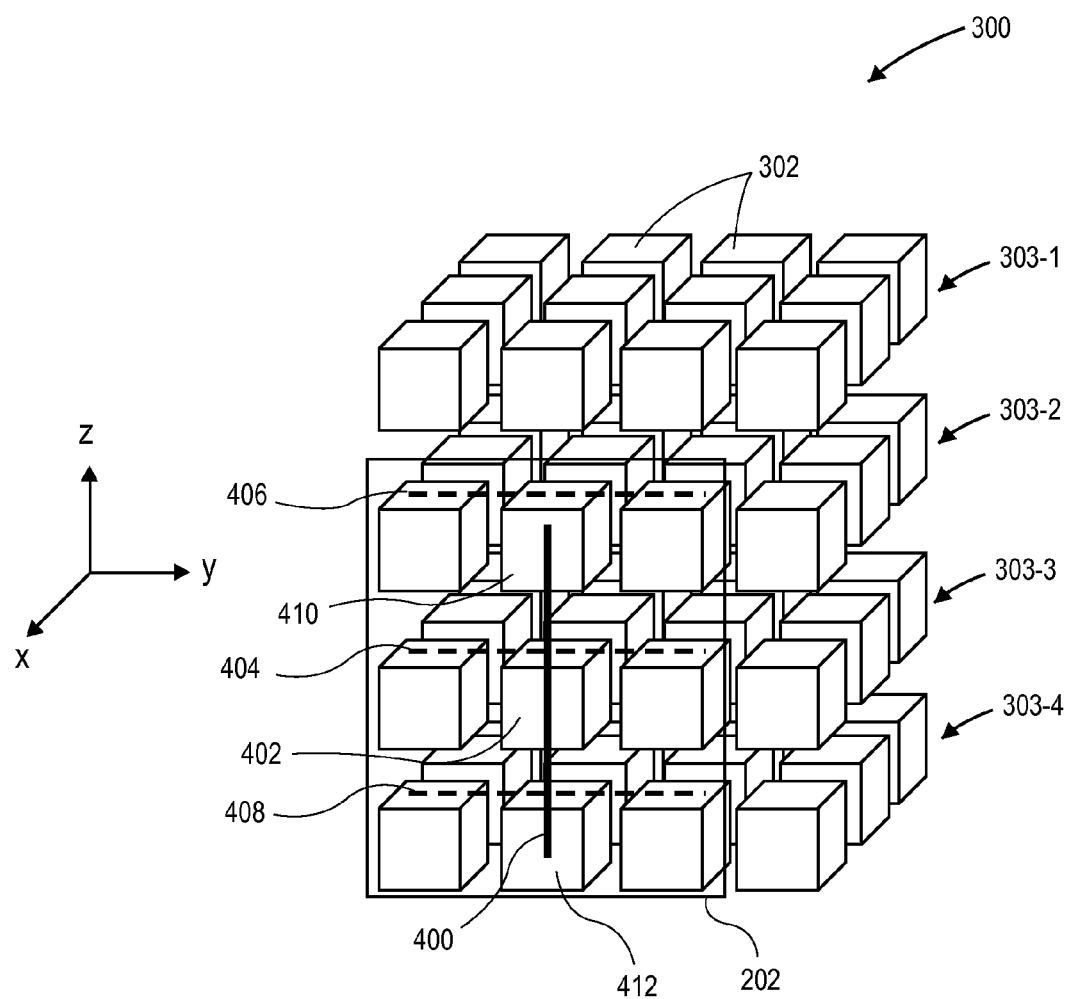
FIG. 5 illustrates a dip line for a subject voxel and a plurality of azimuth lines for voxels intersected by the dip line, according to an embodiment.

The method 100 may also include determining planar values for each, or a select subset, of the voxels 302 with the azimuth angle $\theta_1$ and a range of dip angles $\phi$ (i.e., the angle of the mask plane 202 with respect to the z-axis). FIG. 5 illustrates an example case of such determining, according to an embodiment. The range of dip angles $\phi$ may be −90° and +90°; however, a smaller subset of this range may be prescribed, for example, employing dip angle $\phi$ guidance, using predetermined information to determine what dip angles $\phi$ to avoid, etc. Accordingly, the method 100 may proceed to selecting a dip angle $\phi_1$ in the range of dip angles $\phi$, as at 118. For example, in the illustrated case, the selected dip angle $\phi_1$ is zero degrees. The method 100 may then proceed to again selecting a subject voxel for analysis, as at 120. In the example case, voxel 404 is selected as the subject voxel.

As shown, an embodiment of the method 100 also includes defining a dip line 400 for the subject voxel 402, as at 122. The dip line 400 may extend at the selected dip angle $\phi_1$. With the selected dip angle $\phi$ being zero in this case, the dip line 400 is parallel to the z-axis. The dip line 400 may also extend perpendicular to the layers 303-1, 303-2, 303-3, 303-4 at each selected dip angle $\phi_1, \phi_2, \ldots \phi_m$. Further, the dip line 400 may extend by the second number D2 of voxels 302, as defined by the mask plane 202 at 106. In this case, the second number D2 may be three.

The dip line 400 may intersect voxels 402, 410, and 412. Populating the sum cubes at 114 (e.g., previously) with each of the intermediate sums may include populating the sum cubes with the values of the voxels 302 intersected by azimuth lines 404, 406, 408, as shown. That is, each of the voxels 402, 410, 412 may have been selected as subject voxels at 110 for the azimuth angle $\theta_1$. Thus, summing or otherwise calculating a combination of these intermediate sums, as at 124, may be effectively summing all of the voxels 302 intersected by the mask plane 202 when it is centered on (or otherwise associated with) the subject voxel 402 and oriented at dip angle $\theta_1$ (0°) and the azimuth angle $\theta_1$ (90°). This may yield a "planar sum" associated with the mask plane 202 having the prescribed orientation and dimensions and associated with the subject voxel selected at 120.

Figure 6:
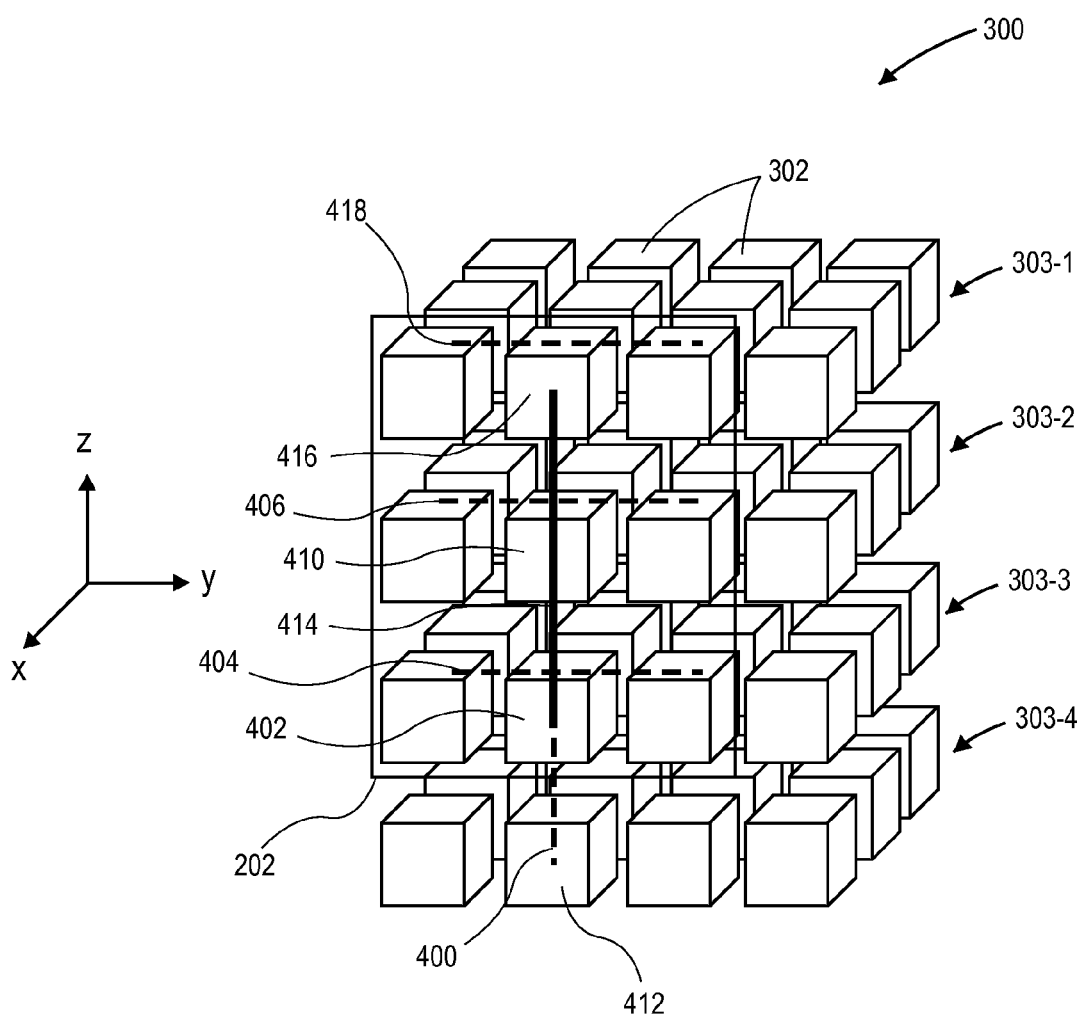
FIG. 6 illustrates a dip line for another subject voxel and a plurality of azimuth lines for voxels intersected by the dip line, according to an embodiment.

The method 100 may then determine whether additional subject voxels are to be analyzed, as at 126. When it is determined that there is one or more additional subject voxels to be selected and analyzed, the method 100 may proceed to iterating back to selecting a (next) subject voxel 410, as at 120. FIG. 6 illustrates the analysis for the next subject voxel 410, according to an embodiment. The method 100 may again define a dip line 414 intersecting the subject voxel 410, and calculating the planar sum for the mask plane 202 centered thereat, or otherwise associated therewith, and oriented at the at the first selected dip angle $\phi_1$ (0°) and the first selected azimuth angle $\theta_1$ (90°).

As with calculating the intermediate sums using the azimuth lines described above with respect to FIG. 4, the method 100 may again capitalize on redundancy by using running sums to calculate the planar sums at 124. Accordingly, the voxel 410 may be chosen as the next subject voxel at 120 since it is adjacent to the previous subject voxel 402 and intersected by the dip line 400. A dip line 414 may be defined, extending the second number D2 of voxels 302 (e.g., three) at the first selected dip angle $\phi_1$, thus intersecting voxels 402 and 410, as well as a voxel 416. As such, the dip line 414 overlaps the dip line 400 by one less than the second number D2 of voxels 302 (e.g., the overlap is for two of the three voxels 302 since, in this case, the second number D2 is three). Accordingly, the sum for previous subject voxel 402 may be subtracted by the intermediate sum associated with the voxel 412 that is intersected by the dip line 400 but not intersected by the dip line 414, and added to the intermediate sum associated with the voxel 416 that is intersected by the dip line 414 and not intersected by the dip line 400. In various embodiments, sequential subject voxels may be displaced by more than one voxel, as discussed above for calculating the intermediate sums.

The intermediate sums for each of the voxels 402, 410, 416 may have already been calculated at iterations passing though the block 114 of FIG. 1 with voxels 402, 410, and 416 acting as subject voxels in turn and defining azimuth lines 406, 404, 418, respectively. Thus, the sum for the dip line 414 is the sum for the mask plane 202 centered at (or otherwise associated with) the subject voxel 410 and oriented at the dip angle $\phi_1$ of 0° and the azimuth angle $\theta_1$ of 90°. This sequence of blocks 120-124, e.g., using running sums, may be repeated for each of the selected subject voxels.

After summing one, a select subset, or all of the voxels 302 in the domain 300 using the dip angle $\phi_1$ and the azimuth angle $\theta_1$, the method 100 may determine that no additional subject voxels are to be analyzed with these parameters, at 126. The method 100 may then proceed to determining whether another dip angle $\phi$ is to be employed as a parameter for calculating planar sums for subject voxels with the azimuth angle $\theta_1$, as at 128. When this is determined, the method may loop back to selecting a dip angle $\phi$ at 118. In this example, a second dip angle $\phi_2$ may be chosen, for example, according to a preset dip angle interval, dip angle guidance, etc.

Figure 7:
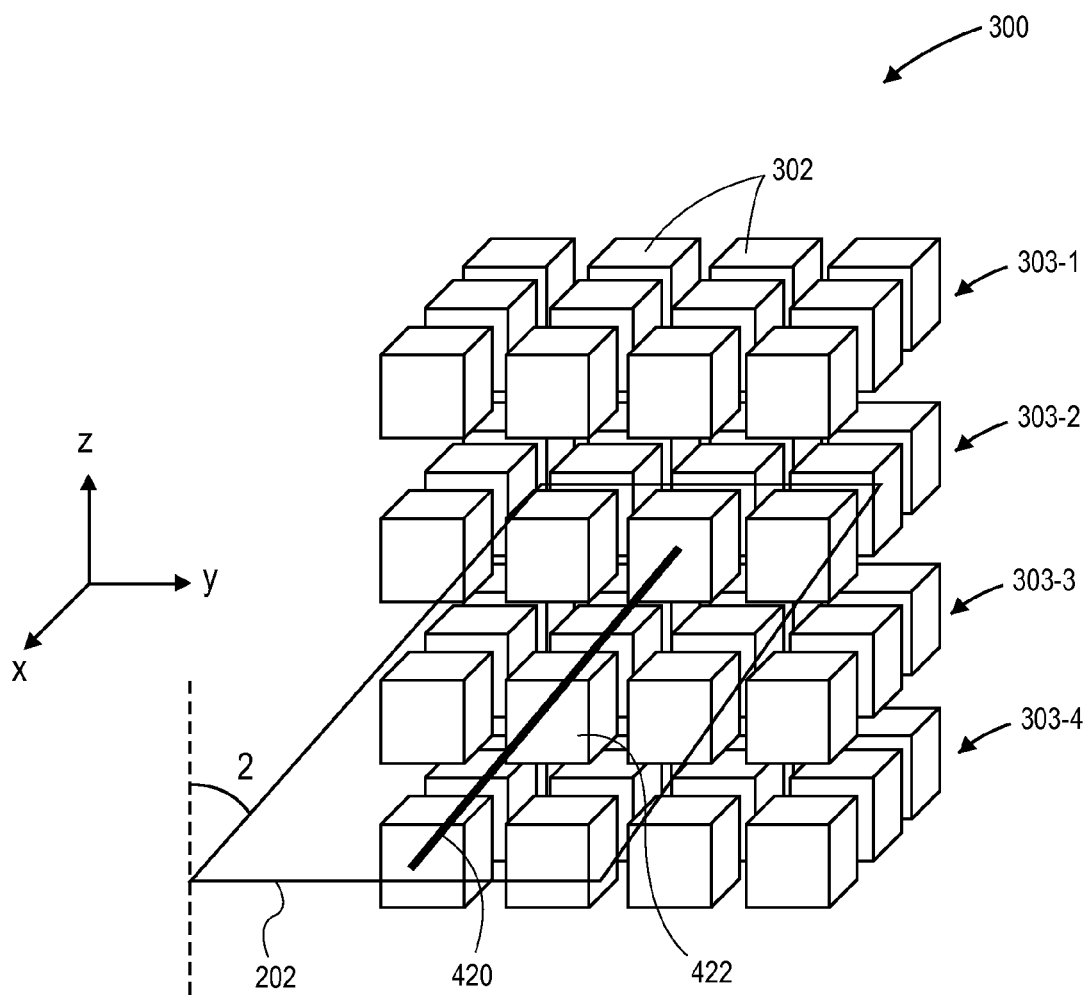
FIG. 7 illustrates a dip line for still another subject voxel and a plurality of azimuth lines for voxels intersected by the dip line, according to an embodiment.

FIG. 7 illustrates the analysis for the subject voxels using the second selected dip angle $\phi_2$, for example, of about 45°, as a parameter. Such calculation may be accomplished in a similar fashion as described for the first selected dip angle $\phi_1$. Accordingly, the method 100 may include selecting a subject voxel 422 at 120 and defining a dip line 420 intersecting, e.g., centered, at the subject voxel 422, as at 122. The dip line 420 may extend at the second dip angle $\phi_2$ by the second number D2 of voxels 302. The intermediate sums for each of the voxels 302 (including subject voxel 422) intersected by the dip line 420 may then be summed, to result in the planar sum for the mask plane 202 centered at or otherwise associated with the subject voxel 422 and oriented at the first azimuth angle $\theta_1$ (e.g., 90°) and the second dip angle $\phi_2$ (e.g., 45°), as at 124. The calculation of planar sums using the second selected dip angle $\phi_2$ (as well as subsequent selected dip angles $\phi_n$) may also incorporate the running sum technique described above.

This process outlined in blocks 118-126 may be repeated, for example, each time the method 100 includes determining that additional dip angles $\phi$ are to be employed as a parameter for analysis with the first azimuth angle $\theta_1$ at 128. Eventually, the method 100 may include determining at 128 that no further dip angles $\phi$ are to be used as a parameter with the first selected azimuth angle $\theta_1$.

At this point, for example, the method 100 may determine whether additional azimuth angles $\theta$ are to be employed for analysis, as at 130. When the method 100 includes determining that additional azimuth angles $\theta$ are to be employed for analysis, the method 100 may return to selecting one of the additional azimuth angles $\theta$ for analysis. In at least one embodiment, a range for azimuth angles $\theta$ may be 0° to 180° or a subset thereof limited based on any one of a variety of factors, such as a priori knowledge of the subterranean formation. For each azimuth angle $\theta$ selected, the portions of the method 100 outlined in blocks 110-128 may repeat until the planar sums for the selected subject voxels are determined for each combination of the selected azimuth angle $\theta_1, \theta_2, \ldots, \theta$, and the selected dip angle $\phi_1, \phi_2, \ldots, \phi_m$. Once this is determined, the method 100 may perform one or more various other analyses or may conclude.

An example of pseudo-code for this embodiment of the method 100 may be substantially as follows:

Define the first dimension D1;
Define the second dimension D2;
For each azimuth angle θ:
    Calculate running horizontal sums of D1 voxels running through the domain in direction θ;
    Save the intermediate results in a sum cube;
    For each dip angle φ:
        Calculate running sums of D2 voxels through the sum cube with dip angle φ, and perpendicular to the direction of the horizontal sums.

In another embodiment, the order of analysis for the azimuth angles θ and the dip angles φ may be reversed. As such, the dip angle $\phi_m$ may be the "first" angle, i.e., the first angle selected in the method 100, and the intermediate sums may be calculated by proceeding through the selected (or all) voxels 302 at the dip angle $\phi_m$. Thereafter, the azimuth angles $\theta_n$ may be employed as the "second angle" with the dip angle $\phi_m$ remaining constant, thereby providing for a calculation of the planar sums. In other words, the iterations through the azimuth angles $\theta_{1-n}$ may be determined for each dip angle $\phi_{1-m}$.

Thus, the number of operations needed for calculating the discrete windowed Radon transform with D1×D2×16 local planes for each voxel consistent with an embodiment of the present disclosure may be D1×8+D1×D2×32 per voxel. This may compare well with the "brute force" method discussed above, in which the time complexity may be $D1^2 \times D2^2 \times 16$ for each voxel. In some cases, this transition to a lower time complexity may enable a three-dimensional windowed Radon transform to be interactive or semi-interactive (i.e., able to be manipulated on demand) rather than impractical or very slow (i.e., creating a lag time of minutes, hours, days, etc.).

In at least one embodiment, the mask plane 202 may also include a thickness τ, also measured in numbers of voxels. This may promote detection of nearly, but not completely, planar distributions of energy in the domain 300. Moreover, the mask plane 202 with thickness τ may be estimated while minimizing additional computing time relative to a mask plane 202 without a thickness. For example, prior to populating the sum cubes with the intermediate sums at 114, the method 100 may include calculating the local sums of voxel sub-cubes having a dimension, for example, of τ×D3×D4, where D3 and D4 may be any suitable number, for example, 1 each or τ each.

Further, the method 100 may rescale the domain 300 or any sub-cube thereof to at least partially distribute data uniformly. For example, the method 100 may include assessing the statistical significance of the sums if the distribution of the input is known (uniform in this example case). This is because sums of random uniformly distributed data may be normally distributed. Thus, the method 100 may include a data rescale transform that may be performed to generate a rescaled cube that subsequently may be processed as described above for the domain 300. In another embodiment, the method 100 may apply such data rescale transform "on the fly" as a preconditioning step for one or more calculations that are performed.

Additionally, the populating the sum cube 114 and/or calculating the planar sum at 124 may or may not proceed as simple summations of values associated with the selected voxels 302. For example, such calculations of the intermediate and/or planar sums may proceed by incorporating one or more additional calculations, statistical analyses, etc., to promote accuracy, precision, and/or conservation of computing resources. For example, the calculations may include parallel or simultaneous calculation of several statistics, such as the sum of squared values associated with each of the voxels 302. In another example, fault line detection may include choosing preferred line segments based on both semblance (e.g., mean) and normalized variance.

Moreover, the method 100 may include dip-field estimation, for example, using data known about the domain 300. Any suitable dip field estimation technique may be employed to steer the search for faults in orientations deviating significantly from the stratigraphic layers, especially, for example, in areas where variation in dip angles φ is too large to narrow the dip range globally.

More than one output value may be defined from the method 100, such as the azimuth angles θ and dip angle φ of the fault or other feature. Such additional information may be used to guide automated fault extraction, e.g., by indicating in which direction to shift for analyzing subsequent voxels and/or limiting or informing the selection of subsequent dip angles φ and/or subsequent azimuth angles θ. In another embodiment, given fault seed points or a seed fault stick interpretation and an edge attribute seismic volume as input, the method 100 may provide robust feature (e.g., fault) auto-tracking by determining the approximate azimuth angles θ and dip angle φ of the feature, and subsequently calculating the three-dimensional transform using a narrow range of dip angles φ and azimuth angles θ to inform the selection of subsequent dip angles φ and/or subsequent azimuth angles θ.

Thus, the method 100 may include estimating the partial derivatives of a fault plane in three dimensions. The calculation of the steering may be efficient, since the transform may be calculated locally and for a narrow range of parameters, e.g., for a small part of the domain 300. The method 100 may also promote the tracking staying on the path with the "highest energy" in the edge cube, and may be robust as to high noise-to-signal ratios if large operator sizes are used.

Accordingly, in various embodiments, the method 100 may be employed for improved, three-dimensional feature detection. For example, the method 100 may include finding the maximum mask planar sum or average over all azimuth angles θ and all dip angles φ as the result output. This planar sum may correspond to "energy" in the plane, with high planar energy indicating the presence of a feature. Thus, the algorithm may be employed in a variety of contexts to search for extreme high or low energy in a domain of voxels, depending on the nature of the input data (e.g. seismic edge attribute), and thereby detect features.

Figure 8:
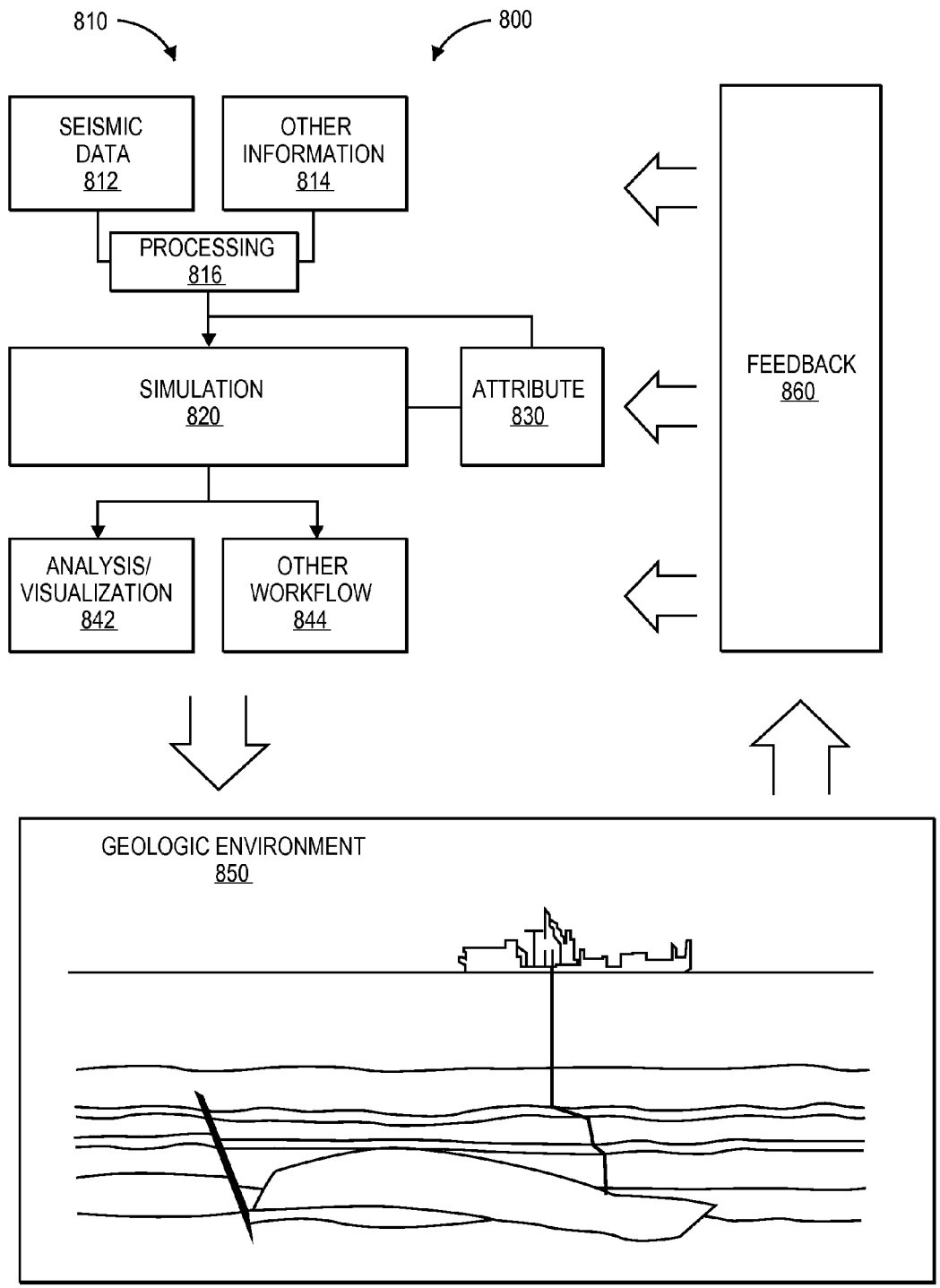
FIG. 8 illustrates a schematic view of a system for simulating a reservoir using seismic data, according to an embodiment.

Moreover, FIG. 8 illustrates one example, among many contemplated, of a system 800 in which one or more embodiments of the method 100 may be implemented. The system 800 includes various management components 810 to manage various aspects of a geologic environment 850, for which an embodiment of the method 100 may be employed to model and/or detect/track features. For example, the management components 810 may allow for direct or indirect management of sensing, drilling, injecting, extracting, etc. with respect to the geologic environment 850. In turn, further information about the geologic environment 850 may become available as feedback 860 (e.g., optionally as input to one or more of the management components 810).

In the example illustrated in FIG. 8, the management components 810 include a seismic data component 812, an information component 814, a processing component 816, a simulation component 820, an attribute component 830, an analysis/visualization component 842, and a workflow component 844. In operation, according to an embodiment, seismic data and other information provided per the components 812 and 814 may be inputted to the simulation component 820, for example, after processing using the processing component 816, which may be configured to implement one or more embodiments of the method 100. The simulation component 820 may process information to conform to one or more attributes, for example, as specified by the attribute component 830, which may be a library of attributes. Such processing may occur prior to input to the simulation component 820 (e.g., per the processing component 816). Further, the simulation component 820 may perform operations on input information based on one or more attributes specified by the attribute component 830. The simulation component 820 may construct one or more models of the geologic environment 850, which may be relied upon to simulate behavior of the geologic environment 850 (e.g., response to one or more acts). In the example of FIG. 8, the analysis/visualization component 842 may allow for interaction with a model or model-based results. Additionally, output from the simulation component 820 may be inputted to one or more other workflows, as indicated by the workflow component 844.

Further, the management components 810 may include features of a commercially-available simulation framework such as the PETREL® seismic to simulation software framework (Schlumberger Limited, Houston, Tex.). The PETREL® framework may provide components that allow for optimization of exploration and development operations. Further, the PETREL® framework may include seismic to simulation software components that may output information for use in increasing reservoir performance, for example, by improving asset team productivity. Through the use of such a framework, various professionals (e.g., geophysicists, geologists, and reservoir engineers) may develop collaborative workflows and integrate operations to streamline processes.

The management components 810 may include features for geology and geological modeling to generate high-resolution geological models of reservoir structure and stratigraphy (e.g., classification and estimation, facies modeling, well correlation, surface imaging, structural and fault analysis, well path design, data analysis, fracture modeling, workflow editing, uncertainty and optimization modeling, petrophysical modeling, etc.). Particular features may allow for performance of rapid three-dimensional seismic interpretation, for example, for integration with geological and engineering tools (e.g., classification and estimation, well-path design, seismic interpretation, seismic attribute analysis, seismic sampling, seismic volume rendering, geobody extraction, domain conversion, etc.). In reservoir engineering, for a generated model, one or more features may allow for simulation workflow to perform streamline simulation, reduce uncertainty and assist in future well planning (e.g., uncertainty analysis and optimization workflow, well path design, advanced gridding and upscaling, history match analysis, etc.). The management components 810 may include features for drilling workflows including well path design, drilling visualization, and real-time model updates (e.g., via real-time data links).

Various aspects of the management components 810 may be add-ons or plug-ins that operate according to specifications of a framework environment. For example, a commercially available framework environment marketed as the OCEAN® framework environment (Schlumberger Limited) allows for seamless integration of add-ons (or plug-ins) into a PETREL® framework workflow. AntTracker™ may be one such add-on or plug-in that may provide one or more aspects of edge detection using the three-dimensional, windowed Radon transform techniques as part of embodiments of the method 100.

Figure 9:
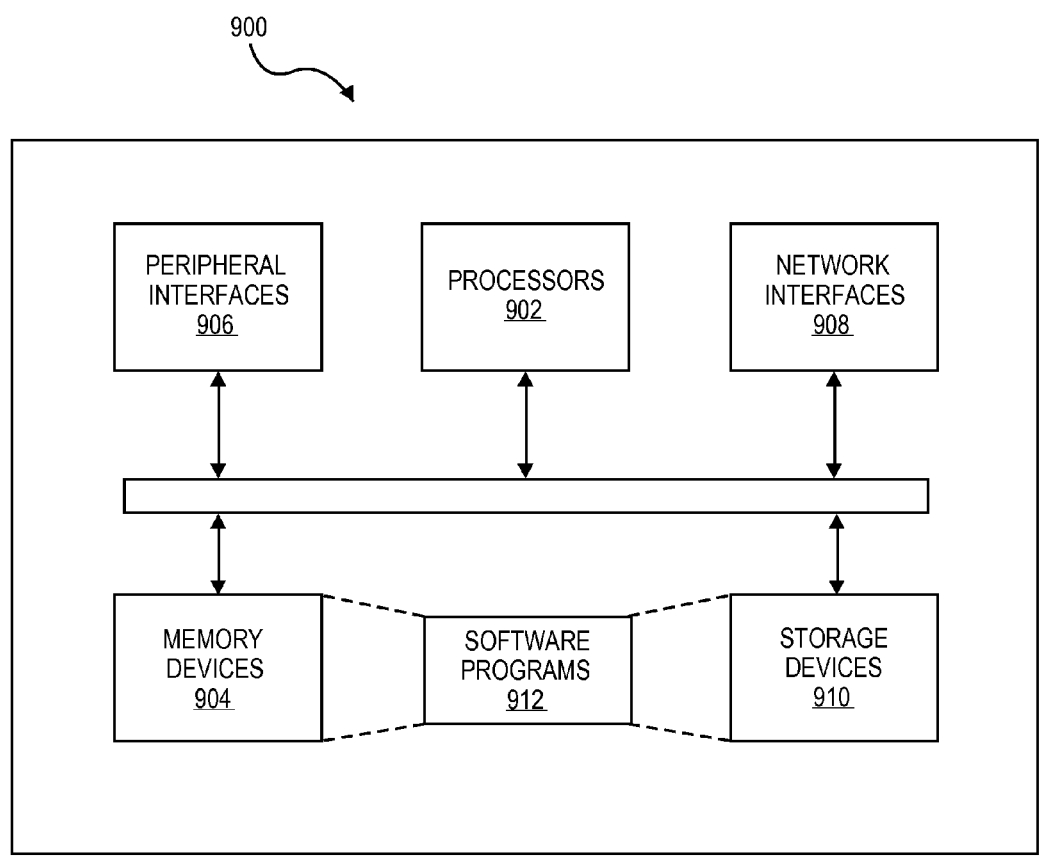
FIG. 9 illustrates a schematic view of a processor system, according to an embodiment.

Embodiments of the disclosure may also include one or more processor (i.e., computing) systems for implementing one or more embodiments of the method 100. FIG. 9 illustrates a schematic view of such a processor system 900, according to an embodiment. The processor system 900 may include one or more processors 902 of varying core (including multiple core) configurations and clock frequencies. The one or more processors 902 may be operable to execute instructions, apply logic, etc. It will be appreciated that these functions may be provided by multiple processors or multiple cores on a single chip operating in parallel and/or communicably linked together.

The processor system 900 may also include a memory system, which may be or include one or more memory devices and/or computer-readable media 904 of varying physical dimensions, accessibility, storage capacities, etc. such as flash drives, hard drives, disks, random access memory, etc., for storing data, such as images, files, and program instructions for execution by the processor 902. In an embodiment, the computer-readable media 904 may store instructions that, when executed by the processor 902, are configured to cause the processor system 900 to perform operations. For example, execution of such instructions may cause the processor system 900 to implement one or more portions and/or embodiments of the method 100 described above.

The processor system 900 may also include one or more network interfaces 908. The network interfaces 908 may include any hardware, applications, and/or other software. Accordingly, the network interfaces 908 may include Ethernet adapters, wireless transceivers, PCI interfaces, and/or serial network components, for communicating over wired or wireless media using protocols, such as Ethernet, wireless Ethernet, etc.

The processor system 900 may further include one or more peripheral interfaces 906, for communication with a display screen, projector, keyboards, mice, touchpads, sensors, other types of input and/or output peripherals, and/or the like. In some implementations, the components of processor system 900 need not be enclosed within a single enclosure or even located in close proximity to one another, but in other implementations, the components and/or others may be provided in a single enclosure.

The memory device 904 may be physically or logically arranged or configured to store data on one or more storage devices 910. The storage device 910 may include one or more file systems or databases in any suitable format. The storage device 910 may also include one or more software programs 912, which may contain interpretable or executable instructions for performing one or more of the disclosed processes. When requested by the processor 902, one or more of the software programs 912, or a portion thereof, may be loaded from the storage devices 910 to the memory devices 904 for execution by the processor 902.

Those skilled in the art will appreciate that the above-described componentry is merely one example of a hardware configuration, as the processor system 900 may include any type of hardware components, including any necessary accompanying firmware or software, for performing the disclosed implementations. The processor system 900 may also be implemented in part or in whole by electronic circuit components or processors, such as application-specific integrated circuits (ASICs) or field-programmable gate arrays (FPGAs).

The foregoing description of several possible embodiments has been presented for purposes of illustration only. It is not exhaustive and does not limit the present disclosure to the precise form disclosed. Those skilled in the art will appreciate from the foregoing description that modifications and variations are possible in light of the above teachings or may be acquired from practicing the disclosed embodiments.

For example, the same techniques described herein with reference to the processor system 900 may be used to execute programs according to instructions received from another program or from another computing system altogether. Similarly, commands may be received, executed, and their output returned entirely within the processing and/or memory of the processor system 900. Accordingly, neither a visual interface command terminal nor any terminal at all is strictly necessary for performing the described embodiments.

Likewise, the steps described need not be performed in the same sequence discussed or with the same degree of separation. Various steps may be omitted, repeated, combined, or divided, as necessary to achieve the same or similar objectives or enhancements. Accordingly, the present disclosure is not limited to the above-described embodiments, but instead is defined by the appended claims in light of their full scope of equivalents.

What is claimed is:

1. A method for analyzing a domain, comprising:
   performing a windowed Radon transform analysis of the domain, wherein performing the windowed Radon transform analysis of the domain comprises:
      defining a mask plane comprising a first dimension of a first number of voxels and a second dimension of a second number of voxels; and
      selecting a plurality of first angles for orientating the mask plane in the domain with respect to a first axis, wherein for each one of the plurality of first angles selected:
         populating, using one or more processors, sum cubes associated with each one of a first plurality of subject voxels, wherein populating the sum cubes for each of the first plurality of subject voxels comprises:
            defining a first line associated with the one of the first plurality of subject voxels, the first line extending at the one of the plurality of first angles, the first line intersecting the first number of voxels including the one of the first plurality of subject voxels; and
            populating the one of the sum cubes associated with the one of the first plurality of subject voxels with an intermediate sum of values associated with each of the first number of voxels intersected by the first line, wherein for at least some of the first plurality of subject voxels, populating comprises using a running sum, and wherein using the running sum comprises:
               determining the intermediate sum calculated for a previous one of the first plurality of subject voxels, wherein the previous one of the first plurality of subject voxels is displaced from a current one of the first plurality of subject voxels by a third number of voxels and the current one of the first plurality of subject voxels is intersected by the first line associated with the previous one of the first plurality of subject voxels; and
               subtracting one or more values of one or more voxels intersected by the first line associated with the previous one of the first plurality of voxels, but not intersected by the first line associated with the current one of the first plurality of voxels; and
         after populating the sum cubes, selecting a plurality of second angles, wherein for each one of the plurality of second angles selected, calculating, using the one or more processors, a planar sum for each one of a second plurality of subject voxels, wherein calculating the planar sum for each one of the second plurality of subject voxels comprises:
            defining a second line extending at the one of the plurality of second angles, intersecting the second number of voxels including the one of the second plurality of subject voxels; and
            calculating a planar sum associated with the one of the second plurality of subject voxels by calculating a sum of values corresponding to the intermediate sums associated with each of the second number of voxels intersected by the second line; and
   detecting a feature in the domain using the planar sum.

2. The method of claim 1, wherein using the running sum for populating the sum cubes for at least some of the first plurality of subject voxels further comprises:
   adding one or more values of one or more voxels intersected by the first line associated with the current one of the first plurality of subject voxels, but not intersected by the first line associated with the previous one of the first plurality of subject voxels.

3. The method of claim 2, wherein subtracting the one or more values comprises subtracting the third number of values and adding the one or more values comprises adding the third number of values.

4. The method of claim 3, wherein the third number is one.

5. The method of claim 1, wherein calculating the planer sum for at least some of the second plurality of subject voxels comprises using a running sum.

6. The method of claim 5, wherein using a running sum for calculating the planar sums for at least some of the second plurality of subject voxels comprises:
   determining the planar sum calculated for a previous one of the second plurality of subject voxels, wherein the previous one of the second plurality of subject voxels is displaced from a current one of the second plurality of subject voxels by a third number of voxels and the current one of the second plurality of subject voxels is intersected by the second line associated with the previous one of the second plurality of subject voxels;
   subtracting one or more values of one or more voxels intersected by the second line associated with the previous one of the second plurality of voxels, but not intersected by the second line associated with the current one of the second plurality of voxels; and
   adding one or more values of one or more voxels intersected by the second line associated with the current one of the second plurality of subject voxels, but not intersected by the second line associated with the previous one of the second plurality of subject voxels.

7. The method of claim 6, wherein the third number is one, such that adding the one or more values comprises adding a single value and subtracting the one or more values comprises subtracting a single value.

8. The method of claim 1, wherein the first lines associated with the first plurality of subject voxels for each of the plurality of first angles extend in one layer of voxels of a plurality of parallel layers of voxels.

9. The method of claim 8, wherein the second lines associated with the second plurality of subject voxels intersect one or more of the plurality of parallel layers.

10. The method of claim 1, wherein the voxels of the first plurality of subject voxels are also the voxels of the second plurality of subject voxels.

11. The method of claim 1, wherein the plurality of first angles are azimuth angles and the plurality of second angles are dip angles.

12. The method of claim 1, wherein:
each first line is centered on the one of the first plurality of subject voxels with which the first line is associated; and
each second line is centered on the one of the second plurality of subject voxels with which the second line is associated.

13. A computing system, comprising:
one or more processors; and
one or more computer readable media storing instructions that, when executed by at least one of the one or more processors, are configured to cause the computing system to perform operations, comprising:
performing a windowed Radon transform analysis of a domain, wherein performing the windowed Radon transform analysis of the domain comprises:
defining a mask plane comprising a first dimension of a first number of voxels and a second dimension of a second number of voxels; and
selecting a plurality of first angles for orientating the mask plane in the domain with respect to a first axis, wherein for each one of the plurality of first angles selected:
populating, using one or more processors, sum cubes associated with each one of a first plurality of subject voxels, wherein populating the sum cubes for each of the first plurality of subject voxels comprises:
defining a first line associated with the one of the first plurality of subject voxels, the first line extending at the one of the plurality of first angles, the first line intersecting the first number of voxels including the one of the first plurality of subject voxels; and
populating the one of the sum cubes associated with the one of the first plurality of subject voxels with an intermediate sum of values associated with each of the first number of voxels intersected by the first line, wherein for at least some of the first plurality of subject voxels, populating comprises using a running sum, wherein using the running sum comprises:
determining the intermediate sum calculated for a previous one of the first plurality of subject voxels, wherein the previous one of the first plurality of subject voxels is displaced from a current one of the first plurality of subject voxels by a third number of voxels and the current one of the first plurality of subject voxels is intersected by the first line associated with the previous one of the first plurality of subject voxels; and
subtracting one or more values of one or more voxels intersected by the first line associated with the previous one of the first plurality of voxels but not intersected by the first line associated with the current one of the first plurality of voxels; and
after populating the sum cubes, selecting a plurality of second angles, wherein for each one of the plurality of second angles selected, calculating, using the one or more processors, a planar sum for each one of a second plurality of subject voxels, wherein calculating the planar sum for each one of the second plurality of subject voxels comprises:
defining a second line extending at the one of the plurality of second angles, intersecting the second number of voxels including the one of the second plurality of subject voxels; and
calculating a planar sum associated with the one of the second plurality of subject voxels by calculating a sum of values corresponding to the intermediate sums associated with each of the second number of voxels intersected by the second line; and
detecting a feature in the domain using the planar sum.

14. The system of claim 13, wherein using the running sum for populating the sum cubes for at least some of the first plurality of subject voxels further comprises:
adding one or more values of one or more voxels intersected by the first line associated with the current one of the first plurality of subject voxels, but not intersected by the first line associated with the previous one of the first plurality of subject voxels.

15. The system of claim 13, wherein calculating the planer sum for at least some of the second plurality of subject voxels comprises:
determining the planar sum calculated for a previous one of the second plurality of subject voxels, wherein the previous one of the second plurality of subject voxels is displaced from a current one of the second plurality of subject voxels by a third number of voxels and the current one of the second plurality of subject voxels is intersected by the second line associated with the previous one of the second plurality of subject voxels;
subtracting one or more values of one or more voxels intersected by the second line associated with the previous one of the second plurality of voxels, but not intersected by the second line associated with the current one of the second plurality of voxels; and
adding one or more values of one or more voxels intersected by the second line associated with the current one of the second plurality of subject voxels, but not intersected by the second line associated with the previous one of the second plurality of subject voxels.

16. The system of claim 13, wherein:
the first lines associated with the first plurality of subject voxels for each of the first angles extend in one layer of voxels of a plurality of parallel layers of voxels; and
the second lines associated with the second intersect one or more of the plurality of parallel layers.

17. A non-transitory computer readable medium storing instructions thereon that, when executed by a processor, are configured to cause a computing system to perform operations, comprising:
performing a windowed Radon transform analysis of a domain, wherein performing the windowed Radon transform analysis of the domain comprises:
calculating intermediate sums for a plurality of first subject voxels, wherein for each one of the first plurality of subject voxels, the one of the intermediate sums associated therewith corresponds to a sum of values associated with voxels that neighbor the one of the first plurality of subject voxels, wherein calculating the first sums comprises:
storing the one of the first sums calculated for a first one of the first subject voxels as a running sum;
subtracting one or more first values associated with one or more voxels from the running sum; and adding one or more second values associated with one or more voxels from the running sum; and calculating a planar sum for a second plurality of subject voxels, wherein for each one of the second plurality of subject voxels, the one of the planar sums associated therewith corresponds to a sum of intermediate sums associated with voxels that neighbor the one of the plurality of second subject voxels; and detecting a feature in the domain using the planar sum.

18. The computer-readable medium of claim 17, wherein the operations further comprise defining azimuth lines centered at each of the plurality of subject voxels, the azimuth lines each intersecting a plurality of voxels, wherein:

calculating the first sums comprises summing values associated with each of the plurality of voxels intersected by the azimuth lines;

a first azimuth line of the azimuth lines for one of the plurality of first subject voxels overlaps a second azimuth line of the azimuth lines for an adjacent one of the plurality of subject voxels;

subtracting the one or more first values associated with one or more voxels from the running sum comprises subtracting from the running sum values associated with one or more of the plurality of voxels that are intersected by the first azimuth line, but not by the second azimuth line; and adding the one or more second values associated with the one or more voxels to the running sum comprises adding to the running sum values associated with one or more of the plurality of voxels that are intersected by the second azimuth line but not the first azimuth line.

19. The computer-readable medium of claim 18, wherein the operations further comprise defining dip lines centered at each of the plurality of subject voxels, the dip lines extending in a plane that is perpendicular to one or more planes in which the azimuth lines extend, each of the dip lines intersecting a plurality of voxels, wherein:

calculating the planar sums comprises summing intermediate sums associated with each of the plurality of voxels intersected by the azimuth lines;

a first dip line of the dip lines for one of the second plurality of subject voxels overlaps a second dip line of the dip lines for an adjacent one of the second plurality of subject voxels;

subtracting from a running sum intermediate sums associated with one or more of the plurality of voxels that are intersected by the first dip line, but not by the second dip line; and adding to the running sum intermediate sums associated with one or more of the plurality of voxels that are intersected by the second dip line but not the first dip line.

20. The method of claim 1, further comprising constructing a model of the domain using the planar sum, wherein the domain comprises a subterranean domain.

* * * * *